(12) United States Patent
Baniecki et al.

(10) Patent No.: US 7,365,327 B2
(45) Date of Patent: Apr. 29, 2008

(54) ELECTROMAGNETIC RADIATION SENSOR AND METHOD FOR FABRICATING THE SAME

(75) Inventors: John David Baniecki, Kawasaki (JP); Takeshi Shioga, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/086,909

(22) Filed: Mar. 23, 2005

(65) Prior Publication Data

US 2005/0161604 A1 Jul. 28, 2005

Related U.S. Application Data

(63) Continuation of application No. PCT/JP03/02704, filed on Mar. 7, 2003.

(51) Int. Cl.
*G01J 5/02* (2006.01)
(52) U.S. Cl. .................................. 250/338.4
(58) Field of Classification Search ............ 250/338.4
See application file for complete search history.

(56) References Cited

U.S. PATENT DOCUMENTS

| | | | |
|---|---|---|---|
| 4,319,485 A | 3/1982 | Terada et al. | |
| 5,443,030 A | 8/1995 | Ishihara et al. | |
| 5,561,307 A * | 10/1996 | Mihara et al. | 257/295 |
| 5,576,928 A * | 11/1996 | Summerfelt et al. | 361/321.1 |
| 5,743,006 A * | 4/1998 | Beratan | 29/840 |
| 5,757,061 A | 5/1998 | Satoh et al. | |
| 5,767,560 A | 6/1998 | Gofuku | |
| 5,986,301 A * | 11/1999 | Fukushima et al. | 257/306 |
| 6,087,651 A | 7/2000 | Koyama | |
| 6,300,612 B1 | 10/2001 | Yu | |
| 6,399,946 B1 | 6/2002 | Hobbs | |
| 6,914,279 B2 * | 7/2005 | Lu et al. | 257/252 |
| 2003/0134136 A1* | 7/2003 | Biscotto et al. | 428/472 |
| 2003/0201164 A1* | 10/2003 | Johnson et al. | 204/192.29 |

FOREIGN PATENT DOCUMENTS

| | | |
|---|---|---|
| EP | 0 661 244 A2 | 7/1995 |
| JP | 55-91101 | 7/1980 |
| JP | 04-266017 | 9/1992 |
| JP | 05-13802 | 1/1993 |
| JP | 5-102499 | 4/1993 |

(Continued)

OTHER PUBLICATIONS

Japanese Office Action dated Oct. 25, 2006, issued in corresponding Japanese Application No. 2004-569107.

*Primary Examiner*—Constantine Hannaher
(74) *Attorney, Agent, or Firm*—Westerman, Hattori, Daniels & Adrian, LLP.

(57) ABSTRACT

An $SiO_2$ layer (3), a Ti layer (4), a Pt layer (5), a PLZT layer (6) and an $IrO_2$ layer (7) are formed sequentially on an Si substrate (2). The $IrO_2$ layer (7) functioning as a top electrode has a thickness of about 100 nm. Since the $IrO_2$ layer (7) has conductivity lower than that of Pt or the like conventionally used as a top electrode and a skin depth deeper than that of Pt or the like, sufficient sensitivity can be attained by a thickness of about 100 nm.

18 Claims, 5 Drawing Sheets

FOREIGN PATENT DOCUMENTS

| | | |
|---|---|---|
| JP | 05-145108 | 6/1993 |
| JP | 05-145109 | 6/1993 |
| JP | 5-206382 | 8/1993 |
| JP | 7-215762 | 8/1995 |
| JP | 8-340085 | 12/1996 |
| JP | 10-27888 | 1/1998 |
| JP | 10-332481 | 12/1998 |
| JP | 11-37838 | 2/1999 |
| JP | 2000-55746 | 2/2000 |
| JP | 2000-228516 | 8/2000 |
| JP | 2001-304955 | 10/2001 |
| JP | 2002-502120 A | 1/2002 |
| JP | 2002-90228 | 3/2002 |
| WO | WO 96/10263 | 4/1996 |

* cited by examiner

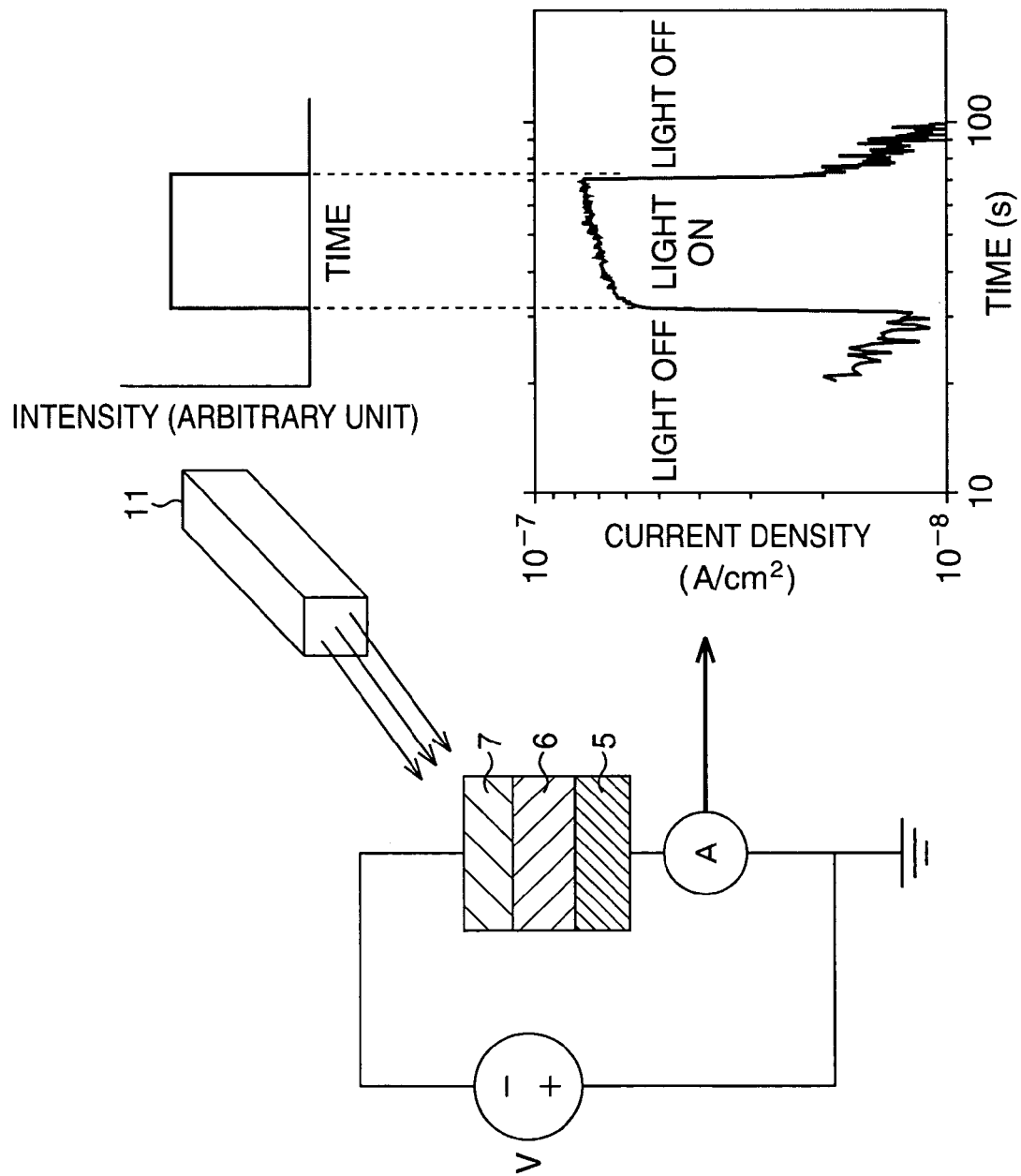

ELECTROMAGNETIC RADIATION SENSOR AND METHOD FOR FABRICATING THE SAME

This application is a continuation of PCT International Patent Application No. PCT/JP03/02704, filed on Mar. 7, 2003, the entire contents of which are incorporated herein by reference.

TECHNICAL FIELD

The present invention relates to an electromagnetic radiation sensor, such as a photosensor or infrared sensor, which detects incident electromagnetic radiation and converts this electromagnetic radiation into an electrical signal, and a method for fabricating the same.

BACKGROUND ART

An electromagnetic radiation sensor having, for example, an MSM (Metal-Semiconductor-Metal) structure, MIM (Metal-Insulator-Metal) structure, or MIS (Metal-Insulator-Semiconductor) structure formed by stacking thin films is widely used as a photosensor of a reader of a CD-ROM, DVD-ROM, or the like, a heat sensor using infrared radiation, or a motion detector. When electromagnetic radiation is incident on the surface of this electromagnetic radiation sensor, a signal of this electromagnetic radiation is converted into an electrical signal.

A thin-film electromagnetic radiation sensor, such as a photodetector or pyroelectric sensor, capable of detecting up to an infrared region sometimes uses the MSM structure or MIM structure. Examples of metals used in these structures are Ni, Cu, Cr, Pt, or Au, each having conductivity $\sigma$ higher than $10^5$ S/m. However, a thin-film electromagnetic radiation sensor having the MSM structure or MIM structure using these metals has the drawback that a large amount of incident electromagnetic radiation is reflected by a metal film.

Several proposals, therefore, are made to increase the absorption efficiency of electromagnetic radiation incident on a thin-film electromagnetic radiation sensor having the MSM structure or MIM structure. Examples are a method of forming an antireflection film on a metal film which functions as a top electrode, a method of decreasing the thickness of a metal film which functions as a top electrode to a few nanometers, and a method of giving a metal film a two-layered structure.

Unfortunately, the formation of the antireflection film increases the fabrication cost.

Also, as described in U.S. Pat. No. 6,399,946, in the method in which the thickness of the metal film which functions as a top electrode is decreased to a few nanometers, if the thickness of the metal film which functions not only as an absorbent but also as a top electrode decreases to a few nanometers, the mechanical strength of the film significantly lowers, and other problem arises. In addition, it is extremely difficult to evenly form a thin film having a thickness of a few nanometers within the range of area of square centimeter order.

Furthermore, as described in U.S. Pat. No. 6,399,946, the fabrication method of giving the metal film a two-layered structure is complicated, so the cost rises, or the yield lowers.

Japanese Patent Application Laid-Open No. 2001-304955 discloses an infrared detecting element having, on a top electrode, an infrared absorbing portion which contains a metal sulfide. However, even this infrared detecting element cannot have sufficient sensitivity if a metal, such as Au, having high conductivity is used as the top electrode. Also, the fabrication is complicated because a layer which serves as the infrared absorbing portion must be formed on the top electrode.

In addition, the conductivity of a transparent conductive oxide, such as an Sr oxide, In oxide, or Pb oxide, is very high, i.e., about $6.25 \times 10^5$ S/m, although it also depends on film formation conditions. If a film like these is used as the top electrode, a leakage current increases, and the trapping effect in a dielectric film rises.

Patent reference 1
U.S. Pat. No. 6,399,946
Patent reference 2
Japanese Patent Application Laid-Open No. 2001-304955

SUMMARY OF THE INVENTION

It is an object of the present invention to provide an electromagnetic sensor which is easy to fabricate and has high sensitivity while the mechanical strength is ensured, an electromagnetic radiation detecting device including the same, and a method for fabricating the same.

An electromagnetic radiation sensor according to the present invention comprises a bottom electrode, a dielectric layer formed on the bottom electrode, and a top electrode formed on the dielectric layer and having a conductive oxide layer. The conductivity of the top electrode is being $10^{-2}$ S/m to $10^5$ S/m.

An electromagnetic radiation detecting device according to the present invention comprises the electromagnetic radiation sensor as described above, and a current meter which measures an output electric current from the electromagnetic radiation sensor.

BRIEF DESCRIPTION OF THE DRAWINGS

FIG. 6 is a schematic view showing a method of measuring a photocurrent and the results of the measurement.

DETAILED DESCRIPTION OF THE PREFERRED EMBODIMENTS (Basic Principle of the Present Invention)

First, the basic principle of the present invention will be explained below.

Electromagnetic radiation incident on a metal film is transmitted through only a shallow region of the surface of the metal film. Letting x be the depth from the surface of the metal film, intensity I(x) of electromagnetic radiation incident on the metal film is represented by $$I(x)=I(0)\exp(-2x/\delta) \quad \text{(equation 1)}$$

If the metal film is formed by a conductor having conductivity σ much higher than εω, a skin depth δ is represented by $$\delta = \sqrt{\frac{2}{\omega\mu\sigma}} \quad \text{(equation 2)}$$

where ε is the dielectric constant of the metal film, ω is the angular frequency of the incident electromagnetic radiation, and μ is the permeability of the metal film.

Figure 1:
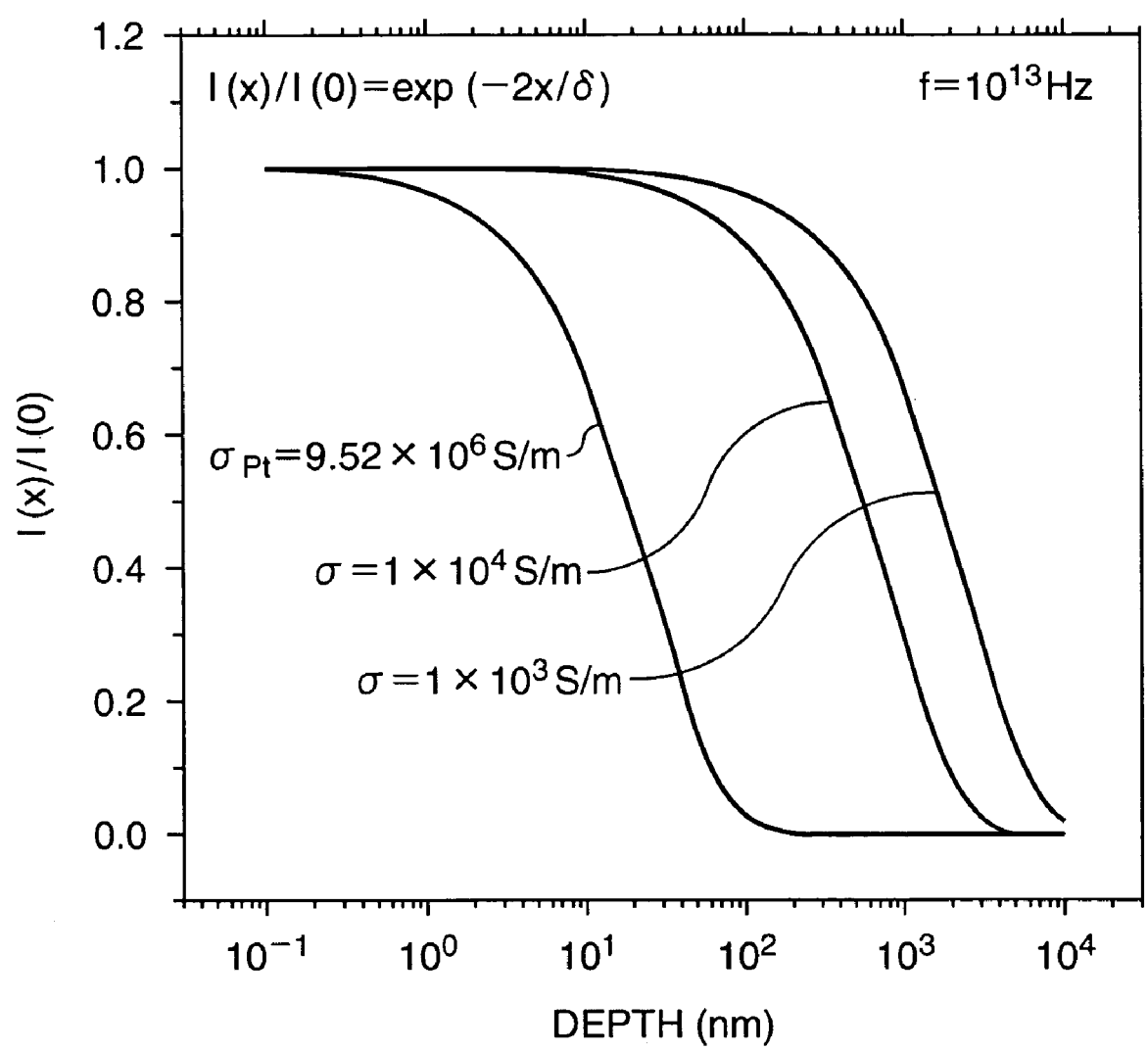
FIG. 1 is a graph showing the relationship between the depth and intensity in a Pt electrode, and the relationship between the depth and intensity in each of an electrode having conductivity $\sigma$ of $10^4$ S/m and an electrode having conductivity $\sigma$ of $10^3$ S/m.

FIG. 1 is a graph showing the relationship between the depth and intensity in a Pt electrode, and the relationship between the depth and intensity in each of an electrode having conductivity σ of $10^4$ S/m and an electrode having conductivity σ of $10^3$ S/m. FIG. 1 is obtained when infrared radiation having frequency of $10^{13}$ Hz is incident. Also, the conductivity of $10^4$ S/m and $10^3$ S/m is obtained by electrodes made of conductive oxide, for example. The conductivity of the Pt electrode is about $9.52 \times 10^6$ S/m, i.e., higher than those of conductive oxides.

As shown in FIG. 1, in the case of the Pt electrode, the intensity of infrared radiation attenuates by the skin effect to about 50% at a depth of about 20 nm from the surface. Electrons combine with photons near the surface of the Pt electrode, and these electrons function as carriers in the interface between the Pt electrode and a dielectric film to allow a photocurrent to flow. When the Pt electrode is to be used, therefore, the thickness of the Pt electrode must be decreased to about a few nm.

As described in U.S. Pat. No. 6,399,946 presented earlier, a method of making the thickness of the top electrode equivalent to the skin depth represented by equation 1 is an example of a method of increasing the sensitivity of a detector. As described in the above-mentioned specification, this method can be achieved by forming a uniform metal film, or by forming a multilayered metal layer including a thick region and thin region.

On the other hand, according to equation 1, as a method of increasing the sensitivity of a sensor, it is also possible to increase the skin depth by decreasing the conductivity of a film used as the top electrode. The present inventors noticed this point and reached the present invention. As shown in FIG. 1, when an electrode such as a conductive oxide having a low conductivity is used, the value of the skin depth by which the same intensity can be obtained increases. For example, when a material having conductivity σ of $10^3$ S/m is used, the attenuation of the infrared intensity is less than 10% even at a depth of about 200 nm. Such results are obtained by electrodes made of conductive metal oxides, for example, $IrO_x$, $SrRuO_x$, and $RuO_x$, each having conductivity of about 0.1 S/m to $10^4$ S/m. This conductivity is one to four orders of magnitude lower than that of Pt. The conductivity of a conductive metal oxide can be adjusted by controlling the composition or microstructure of the metal oxide.

Figure 2A:
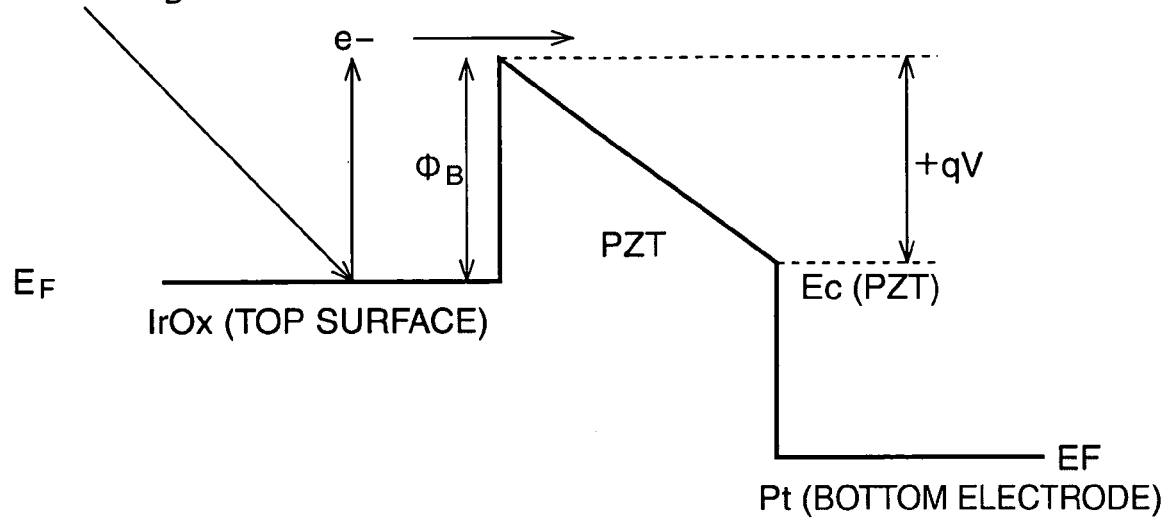
FIG. 2A is a band diagram showing a mechanism by which an electric current flows when electromagnetic radiation is incident on a top electrode.
Figure 2B:
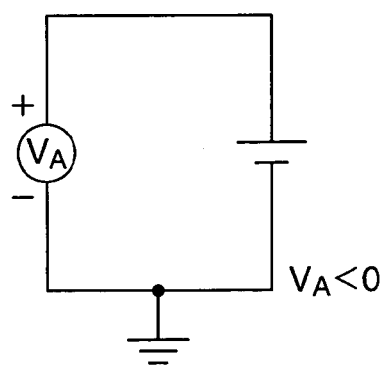
FIG. 2B is a circuit diagram showing the bias state of a sensor.

When an electrode made of a conductive oxide is formed on a high dielectric constant film or on a ferroelectric film, the Schottky junction generates with respect to a barrier which fluctuates within the range of about 0.4 eV to 1.5 eV. This range of the barrier corresponds to a cut-off wavelength for wavelengths from about $8 \times 10^{-7}$ m to $2.5 \times 10^{-6}$ m to infrared radiation. As shown in FIGS. 2A and 2B, a cut-off wavelength λ is represented by $$\lambda = \frac{hc}{\Phi_B} \quad \text{(equation 3)}$$

where h is the Planck constant, c is the light velocity, and $\Phi_B$ is the height of an effective barrier by which electron emission may occur in the Schottky junction between a top electrode (in this case, an $IrO_x$ electrode) and an underlying film (in this case, a PZT film). Also, ν in FIG. 2A is the wavelength of incident electromagnetic radiation (in this case, infrared radiation).

Note that the height $\Phi_B$ of the barrier can be adjusted by, for example, the film formation conditions of the PZT film or $IrO_x$ electrode, the annealing conditions after the film formation, or doping of an impurity into the film itself or to the vicinity of the interface. The cut-off wavelength can be adjusted by thus adjusting the height $\Phi_B$ of the barrier.

Examples of a method of adjusting the height $\Phi_B$ of the barrier are a method of doping an impurity into the boundary between the top electrode and the dielectric layer such as a PZT layer, a method of adding a positively charged or non-charged impurity to the dielectric layer by a sol-gel method or sputtering method when the dielectric layer is formed, and a method of performing annealing in an oxygen atmosphere, a nitrogen atmosphere and/or an argon atmosphere, or in a vacuum, after a stacked structure including the dielectric layer and top electrode is formed on the bottom electrode.

First Embodiment

Figure 3:
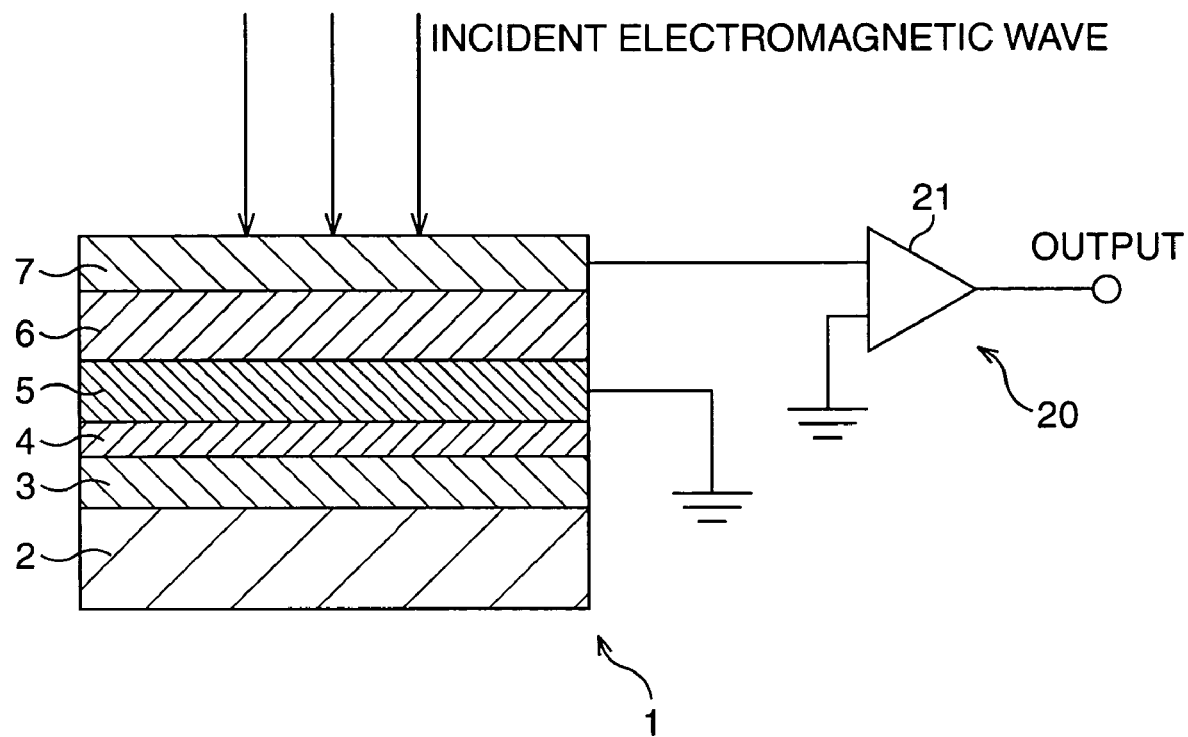
FIG. 3 is a schematic view showing the structure of a thin-film electromagnetic radiation sensor according to a first embodiment of the present invention.

The first embodiment of the present invention will be described below. FIG. 3 is a schematic view showing the structure of a thin-film electromagnetic radiation sensor according to the first embodiment of the present invention.

In a thin-film electromagnetic radiation sensor 1, an $SiO_2$ layer 3, Ti layer 4, Pt layer 5, PLZT ((Pb,La)(Zr,Ti)$O_3$) layer 6, and $IrO_2$ layer 7 are sequentially formed on an Si substrate 2. The thicknesses of the Ti layer 4, Pt layer 5, PLZT ((Pb,La)(Zr,Ti)$O_3$) layer 6, and $IrO_2$ layer 7 are, for example, about 20 nm, 100 nm, 200 nm, and 100 nm, respectively.

Although the Ti layer 4 is formed as an adhesive layer which adheres the Pt layer 5 as a bottom electrode and the Si substrate 2, the Ti layer 4 also functions as a part of the bottom electrode. The PLZT layer 6 is a ferroelectric layer and formed by, for example, a sol-gel method, RF sputtering method, or metal organic CVD (MOCVD) method. The $IrO_2$ layer 7 functions as a top electrode. The $IrO_2$ layer 7 is formed by, for example, reactive sputtering method.

Also, the electric potential of the Pt layer 5 as a bottom electrode is fixed to the ground potential. A current amplifier 21 is connected as a current detection circuit 20 to the $IrO_2$ layer 7 as a top electrode. The thin-film electromagnetic radiation sensor 1 and current amplifier 21 compose an electromagnetic radiation detecting device. This electromagnetic radiation detecting device is used as a photodetector of, for example, a CD-ROM drive or DVD-ROM drive.

In the thin-film electromagnetic radiation sensor 1 having the above arrangement, when electromagnetic radiation lower than the cut-off wavelength represented by equation 3 is incident on the $IrO_2$ layer 7 (top electrode) while a voltage of, for example, 4 V is biased, electrons equal to or lower than the Fermi level of the IrO$_2$ layer 7 absorb quanta (photons, for example), and these electrons are given energy hv and injected into the conduction band of the PLZT layer 6. This is the same as the case using the PZT film shown in FIG. 2A. As a consequence, a photocurrent flows between the top and bottom electrodes.

After that, the current detection circuit 20 detects the photocurrent flowing between the top and bottom electrodes. This photocurrent represents information contained in the electromagnetic radiation.

In the first embodiment as described above, since the top electrode is formed of the IrO$_2$ layer 7 having low conductivity, the skin depth is large, and a sufficient photocurrent flows even when the thickness is increased. Accordingly, high sensitivity can be obtained while the mechanical strength of the top electrode is kept high.

Second Embodiment

Figure 4:
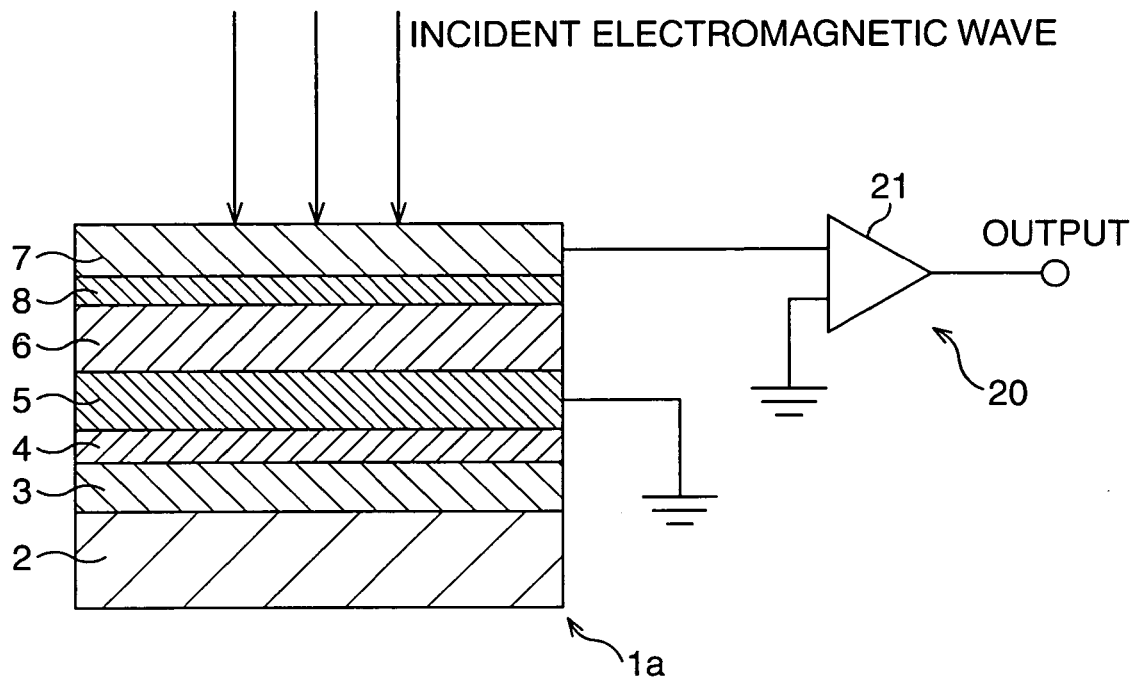
FIG. 4 is a schematic view showing the structure of a thin-film electromagnetic radiation sensor according to a second embodiment of the present invention.

The second embodiment of the present invention will be described below. FIG. 4 is a schematic view showing the structure of a thin-film electromagnetic radiation sensor according to the second embodiment of the present invention.

A thin-film electromagnetic radiation sensor 1a differs from the thin-film electromagnetic radiation sensor 1 according to the first embodiment in that a Pt layer 8 is formed between a PLZT layer 6 and IrO$_2$ layer 7. The thickness of the Pt layer 8 is equal to or smaller than a skin depth, and is about 5 nm, for example. The Pt layer 8 is formed by DC sputtering method.

In the thin-film electromagnetic radiation sensor 1a having the above arrangement, the presence of the Pt layer 8 makes the height of a barrier higher by about 0.8 eV to 1 eV than that in the thin-film electromagnetic radiation sensor 1.

Note that in the fabrication of the thin-film electromagnetic radiation sensor 1a, it is preferable to form the Pt layer 8 and IrO$_2$ layer 7 on the PLZT layer 6, and then pattern the Pt layer 8 and IrO$_2$ layer 7 into an appropriate planar shape at once.

It is also possible to form, instead of the Pt layer 8, a layer containing a transition metal, a noble metal, an alloy of noble metals, an alloy of a noble metal and another metal, or a conductive oxide of a noble metal, for example, Pb, Ir, Ru, Rh, Re, Au, Ag, Cu, Ni, and Cr.

Third Embodiment

Figure 5:
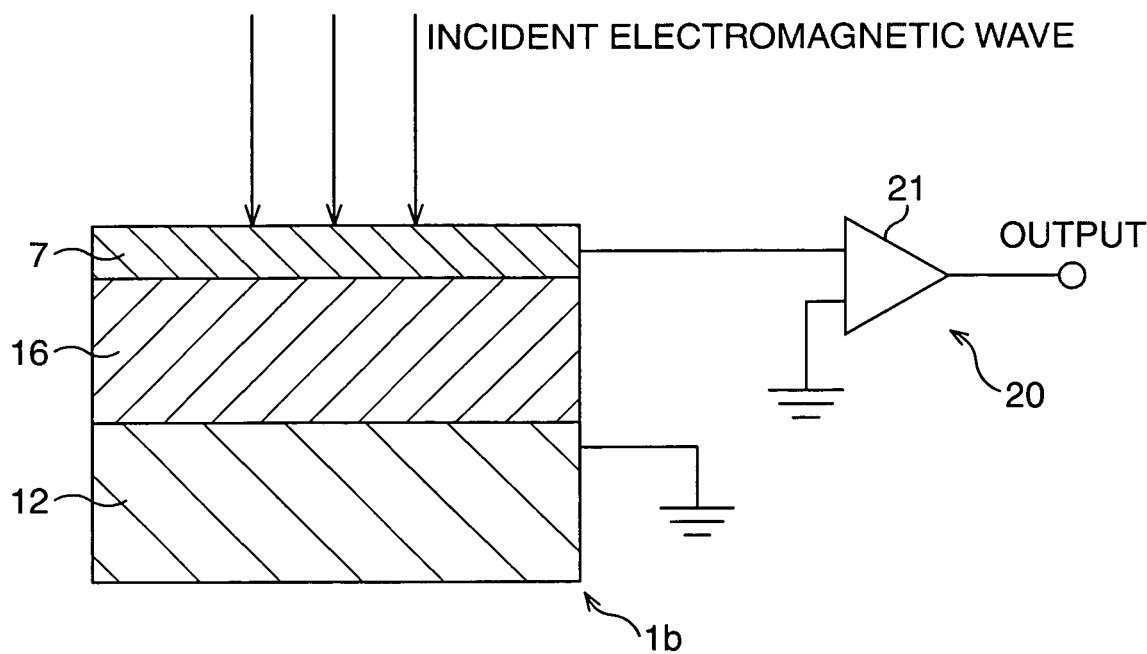
FIG. 5 is a schematic view showing the structure of a thin-film electromagnetic radiation sensor according to a third embodiment of the present invention.

The third embodiment of the present invention will be described below. FIG. 5 is a schematic view showing the structure of a thin-film electromagnetic radiation sensor according to the third embodiment of the present invention.

In a thin-film electromagnetic radiation sensor 1b, an SrTiO$_3$ layer 16 and IrO$_2$ layer 7 are sequentially formed on an n-type Si substrate 12. The thickness of the SrTiO$_2$ layer 16 is, for example, about 100 nm. The SrTiO$_3$ layer 16 is formed by pulse laser deposition method or RF magnetron sputtering method, for example.

In this embodiment, the n-type Si substrate 12 functions as a bottom electrode, and the IrO$_2$ layer 7 functions as a top electrode.

The same effects as the first embodiment can also be obtained by the thin-film electromagnetic radiation sensor 1b having the above arrangement.

EXAMPLE

The results of an experiment conducted on the sensitivity of the thin-film electromagnetic radiation sensor 1 according to the first embodiment fabricated by the present inventors will be explained below.

In this experiment, as shown in FIG. 6, a bottom electrode, dielectric film, and top electrode were formed by a 100-nm thick Pt layer 5, 200-nm thick PLZT layer 6, and IrO$_2$ layer 7, respectively. Also, as in the first embodiment, a bias of 4 V was applied between the top and bottom electrodes.

When light was emitted from a white light source 11 toward the IrO$_2$ layer 7 as the top electrode, an analog waveform shown in FIG. 6 was obtained. That is, the intensity when the light was emitted was about eight times that when no light was emitted. Accordingly, as shown by a graph depicted above the graph indicating the analog waveform, ON/OFF of the light emission could be easily detected in a digital manner. No such effect is obtained if a Pt layer having the same thickness as above is used as the top electrode.

Note that instead of the Si substrate 2, a Ge substrate or SiGe substrate may also be used, or a substrate made of a compound semiconductor of group 3 and 5 elements may also be used. Likewise, instead of the n-type Si substrate 12, a p-type substrate, or a Ge substrate, an SiGe substrate, or a compound semiconductor substrate (a GaAs substrate, InAs substrate, or InP substrate, for example) of group 3 and 5 elements, in each of which a donor or acceptor is doped, may also be used as a substrate which functions as a bottom electrode.

In addition, as an insulator layer made of a high dielectric constant oxide, it is also possible to form a layer made of, for example, BaTiO$_3$, PZT (Pb(Zr,Ti)O$_3$), PLZT ((Pb,La) (Zr,Ti)O$_3$), SiO$_2$, Al$_2$O$_3$, TiO$_2$, Ta$_2$O$_5$, LiTaO$_3$, BaTiO$_3$, SrTiO$_3$, (Ba,Sr)TiO$_3$, Bi$_4$Ti$_3$O$_{12}$, SrBi$_4$Ti$_4$O$_{15}$, SrBi$_2$Ta$_2$O$_9$, SrBi$_2$Nb$_2$O$_9$, KNbO$_3$, Pb(Mg$_{1/3}$Nb$_{2/3}$)O$_3$, or strontium bismuth niobate tantalate, instead of the SiO$_2$ layer 3, or to form an insulator layer made of a nitride or oxynitride, instead of the SiO$_2$ layer 3. The form of this insulator layer is not particularly limited, so the layer may be xerogel or a stacked structure in which a plurality of layers are stacked.

Also, instead of the Ti layer 4, it is also possible to form, as an adhesive layer, a layer made of a transition metal, a noble metal, an alloy of noble metals, an alloy of a noble metal and another metal, a conductive oxide of a noble metal, an insulating metal oxide, an insulating metal nitride, or a conductive metal nitride, for example, Pt, Ir, Zr, Ti, TiO$_x$, IrO$_x$, PtO$_x$, ZrO$_x$, TiN, TiAlN, TaN, or TaSiN.

Furthermore, instead of the Pt layer 5, it is also possible to form, as a bottom electrode, a layer containing one type or two or more types of a transition metal, a noble metal, an alloy of noble metals, an alloy of a noble metal and another metal, or a conductive oxide of a noble metal, for example, Pb, Ir, Ru, Rh, Re, Os, PtO$_x$, IrO$_x$, RuO$_x$, Au, Ag, and Cu.

Note that the dielectric layer formed between the top and bottom electrodes is not limited to a perovskite ferroelectric layer (PZT layer or PLZT layer). For example, it is also possible to form a dielectric layer containing one type or two or more types of silicon dioxide (SiO$_2$), aluminum oxide (Al$_2$O$_3$), titanium dioxide (TiO$_2$), tantalum pentoxide (Ta$_2$O$_5$), lithium tantalate (LiTaO$_3$), barium titanate (BaTiO$_3$), strontium titanate (SrTiO$_3$), barium strontium titanate ((Ba,Sr)TiO$_3$), bismuth titanate (Bi$_4$Ti$_3$O$_{12}$), strontium bismuth titanate (SrBi$_4$Ti$_4$O$_{15}$) strontium bismuth tantalate (SrBi$_2$Ta$_2$O$_9$), strontium bismuth niobate (SrBi$_2$Nb$_2$O$_9$), strontium bismuth niobate tantalate, lead titanate zirconate ((Pb(Zr,Ti)O$_3$), lanthanum lead titanate zirconate ((Pb,La)(Zr,Ti)O$_3$), potassium niobate (KNbO$_3$), or magnesium lead niobate (Pb (Mg$_{1/3}$Nb$_{2/3}$)O$_3$), each containing doped impurities. Alternatively, a dielectric layer made of poly vinylidene difluoride (PVDF), triglycine sulphate (TGS), or deuterated triglycine sulphate (DTGS) may also be formed.

Also, a perovskite oxide represented by formula ABO$_3$ contains an acidic oxide of a metal element which belongs to group 4B (Ti, Zr, and Hf), group 5B (V, Nb, and Ta), group 6B (Cr, Mo, and W), group 7B (Mn and Re), or group 1B (Cu, Ag, and Au). Examples of this perovskite oxide are (Ba,Sr)TiO$_3$ and PbTiO$_3$. It is also possible to form a dielectric layer made of a pyrochlore oxide such as Pb$_2$(ZrTi)$_2$ O$_7$ represented by formula A$_2$B$_2$O$_z$ (6≦z≦7).

The conductivity of the top electrode is preferably $10^{-2}$ S/m to $10^5$ S/m. This is so because, if the conductivity is less than $10^{-2}$ S/m, the conductibility becomes much lower than that required for an electrode, and, if the conductivity exceeds $10^5$ S/m, the conductibility required for an electrode is ensured, but the skin depth decreases to lower the sensitivity, so the thickness of the top electrode must be decreased to such an extent that no sufficient mechanical strength can be maintained any longer. Also, the thickness of the top electrode is preferably 1 nm to $10^4$ nm. This is so because, if the thickness is less than 1 nm, the mechanical strength becomes insufficient in some cases, and, if the thickness exceeds $10^4$ nm, the sensitivity sometimes lowers.

Furthermore, the conductive oxide layer forming the top electrode may contain IrO$_x$, RuO$_x$, PtO$_x$, or AuO$_x$ (0.1≦x≦4), or contains LaNiO$_y$, (LaSr)CoO$_y$, or SrRuO$_y$ (2≦y≦4), for example.

In addition, the current detection circuit (current meter) 20 may be connected in series or parallel with the electromagnetic radiation sensor.

INDUSTRIAL APPLICABILITY

In the present invention as has been explained in detail above, high sensitivity can be obtained even when a top electrode has a relatively large thickness. Therefore, sufficient mechanical strength can be assured. This also facilitates fabrication.

What is claimed is:

1. An electromagnetic radiation sensor comprising:
a substrate,
a bottom electrode formed on said substrate;
a dielectric layer formed on said bottom electrode; and
a top electrode formed on said dielectric layer and having a conductive oxide layer, conductivity of said top electrode being $10^{-2}$ S/m to $10^5$ S/m;
wherein said conductive oxide layer contains one type of a material selected from the group consisting of IrO$_x$, RuO$_x$, PtO$_x$, and AuO$_x$ (0.1≦x≦4), and
wherein said substrate is one selected from the group consisting of an Si, a Ge substrate, an SiGe substrate, and a compound semiconductor substrate of group 3 and 5 elements.

2. The electromagnetic radiation sensor according to claim 1, wherein a thickness of said top electrode is 1 nm to $10^4$ nm.

3. The electromagnetic radiation sensor according to claim 1, further comprising an insulator layer formed between said substrate and bottom electrode, and made of one type of a material selected from the group consisting of an oxide, nitride, and oxynitride.

4. The electromagnetic radiation sensor according to claim 3, wherein said insulator layer is made of a high dielectric constant oxide.

5. The electromagnetic radiation sensor according to claim 1, further comprising an adhesive layer which adheres said bottom electrode and substrate to each other, said adhesive layer containing at least one type of a material selected form the group consisting of a noble metal, an alloy of noble metals, an alloy of a noble metal and another metal, a conductive oxide of a noble metal, an insulating metal oxide, an insulating metal nitride, and a conductive metal nitride.

6. The electromagnetic radiation sensor according to claim 1, further comprising an adhesive layer which adheres said bottom electrode and substrate to each other, said adhesive layer containing at least one type of a material selected form the group consisting of Pt, Ir, Zr, Ti, TiO$_x$, IrO$_x$, PtO$_x$, ZrO$_x$, TiN, TiAlN, TaN, and TaSiN.

7. The electromagnetic radiation sensor according to claim 1, wherein said bottom electrode has a film containing at least one type of a material selected from the group consisting of a noble metal, an alloy of noble metals, an alloy of a noble metal and another metal, and a conductive oxide of a noble metal.

8. The electromagnetic radiation sensor according to claim 1, wherein said bottom electrode has a film containing at least one type of a material selected from the group consisting of Pt, Pb, Ir, Ru, Rh, Re, Os, PtO$_x$, IrO$_x$, RuO$_x$, Au, Ag, and Cu.

9. The electromagnetic radiation sensor according to claim 1, wherein said bottom electrode is one selected from the group consisting of an Si substrate, a Ge substrate, an SiGe substrate, and a compound semiconductor substrate of group 3 and 5 elements, in each of which a donor or acceptor is doped.

10. The electromagnetic radiation sensor according to claim 1, wherein said dielectric layer is made of a perovskite oxide.

11. The electromagnetic radiation sensor according to claim 10, wherein said dielectric layer is made of a perovskite oxide containing an acidic oxide of one type of a metal element selected from the group consisting of a group 4B element, group 5B element, group 6B element, group 7B element, and group 1B element.

12. The electromagnetic radiation sensor according to claim 1, wherein said dielectric layer contains at least one type of a material selected from the group consisting of silicon dioxide, aluminum oxide, titanium dioxide, tantalum pentoxide, lithium tantalate, barium titanate, strontium titanate, barium strontium titanate, bismuth titanate, strontium bismuth titanate, strontium bismuth tantalate, strontium bismuth niobate, strontium bismuth niobate tantalate, lead titanate zirconate, lanthanum lead titanate zirconate, potassium niobate, or magnesium lead niobate, in each of which an impurity is doped.

13. An electromagnetic radiation sensor comprising:
a substrate,
a bottom electrode formed on said substrate;
a dielectric layer formed on said bottom electrode; and
a top electrode formed on said dielectric layer and having a conductive oxide layer, conductivity of said top electrode being $10^{-2}$ S/m to $10^5$ S/m;
wherein said top electrode has a film formed between said conductive oxide layer and dielectric layer, said film containing at least one type of a material selected from the group consisting of a noble metal, an alloy of noble metals, an alloy of a noble metal and another metal, and a conductive oxide of a noble metal, and wherein said substrate is one selected from the group consisting of an Si substrate, a Ge substrate, an SiGe substrate, and a compound semiconductor substrate of group 3 and 5 elements.

14. An electromagnetic radiation sensor comprising:

a substrate;

a bottom electrode formed on said substrate;

a dielectric layer formed on said bottom electrode; and a top electrode formed on said dielectric layer and having a conductive oxide layer, conductivity of said top electrode being $10^{-2}$ S/m to $10^5$ S/m;

wherein said top electrode has a film formed between said conductive oxide layer and dielectric layer, said film containing at least one type of an element selected from the group consisting of Pt, Pb, Ir, Ru, Rh, Re, Au, Ag, Cu, Ni, and Cr, and wherein said substrate is one selected from the group consisting of an Si, a Ge substrate, an SiGe substrate, and a compound semiconductor substrate of group 3 and 5 elements.

15. An electromagnetic radiation sensor fabrication method comprising the steps of:

forming a bottom electrode on a substrate;

forming a dielectric layer on said bottom electrode; and forming, on the dielectric layer, a top electrode having a conductive oxide layer, conductivity of said top electrode being $10^{-2}$ S/m to $10^5$ S/m;

wherein said conductive oxide layer contains one type of a material selected from the group consisting of $IrO_x$, $RuO_x$, $PtO_x$, and $AuO_x$ ($0.1 \leq x \leq 4$), and wherein said substrate is one selected from the group consisting of an Si, a Ge substrate, an SiGe substrate, and a compound semiconductor substrate of group 3 and 5 elements.

16. The electromagnetic radiation sensor fabrication method according to claim 15, further comprising the step of doping an impurity into a interface between the top electrode and dielectric layer.

17. The electromagnetic radiation sensor fabrication method according to claim 15, wherein, in the step of forming the dielectric layer, a dielectric layer containing a positively or negatively charged impurity is formed.

18. An electromagnetic radiation detecting device comprising:

an electromagnetic radiation sensor including:

a substrate, a bottom electrode formed on said substrate;

a dielectric layer formed on said bottom electrode; and a top electrode formed on said dielectric layer and having a conductive oxide layer, conductivity of said top electrode being $10^{-2}$ S/m to $10^5$ S/m; and a current meter which measures an output electric current from said electromagnetic radiation sensor;

wherein said conductive oxide layer contains one type of a material selected from the group consisting of $IrO_x$, $RuO_x$, $PtO_x$, and $AuO_x$ ($0.1 \leq x \leq 4$, and)

wherein said substrate is one selected from the group consisting of an Si, a Ge substrate, an SiGe substrate, and a compound semiconductor substrate of group 3 and 5 elements.

* * * * *